United States Patent
Li et al.

(10) Patent No.: US 12,550,376 B2
(45) Date of Patent: Feb. 10, 2026

(54) WORK FUNCTION METAL PATTERNING AND MIDDLE-OF-LINE SELF-ALIGNED CONTACTS FOR NANOSHEET TECHNOLOGY

(71) Applicant: International Business Machines Corporation, Armonk, NY (US)

(72) Inventors: Juntao Li, Cohoes, NY (US); Ruilong Xie, Niskayuna, NY (US); Julien Frougier, Albany, NY (US); Min Gyu Sung, Latham, NY (US); Chanro Park, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 407 days.

(21) Appl. No.: 18/354,946

(22) Filed: Jul. 19, 2023

(65) Prior Publication Data
US 2025/0031414 A1    Jan. 23, 2025

(51) Int. Cl.
  *H10D 30/67*   (2025.01)
  *H10D 62/10*   (2025.01)
  *H10D 84/83*   (2025.01)

(52) U.S. Cl.
  CPC ..... *H10D 30/6735* (2025.01); *H10D 30/6757* (2025.01); *H10D 62/121* (2025.01); *H10D 84/83* (2025.01)

(58) Field of Classification Search
  CPC ........... H10D 30/6735; H10D 30/6757; H10D 84/83; H10D 62/121
  See application file for complete search history.

(56) References Cited

U.S. PATENT DOCUMENTS

| | | |
|---|---|---|
| 9,318,552 B2 | 4/2016 | Xie et al. |
| 10,510,620 B1 | 12/2019 | Chanemougame et al. |
| 11,049,935 B2 | 6/2021 | Cheng et al. |
| 11,094,827 B2 | 8/2021 | Shen et al. |
| 2018/0108770 A1 | 4/2018 | Cheng et al. |
| 2021/0305380 A1 | 9/2021 | Bouche et al. |
| 2021/0305400 A1* | 9/2021 | Hsu ............ H10D 64/691 |
| 2022/0037498 A1 | 2/2022 | Lin et al. |
| 2022/0069101 A1* | 3/2022 | Choi ............ H10D 30/014 |
| 2023/0101212 A1 | 3/2023 | Chandhok et al. |

FOREIGN PATENT DOCUMENTS

CN    103839819 A    6/2014

OTHER PUBLICATIONS

Lee et al., "Message to the undecided: using DUV dBARC for 32-nm node implants." Advances in Resist Materials and Processing Technology XXVI. vol. 7273. SPIE, 2009, pp. 72730Y-1 to 72730Y-12.

* cited by examiner

*Primary Examiner* — Changhyun Yi
(74) *Attorney, Agent, or Firm* — CANTOR COLBURN LLP; Samuel Waldbaum

(57) ABSTRACT

A semiconductor device fabrication method is provided and includes forming first and second stacks each including a dual layer top dielectric cap (TDC), sequentially surrounding each layer and a portion of the dual layer TDC of the first stack with high-k dielectric, a first work function metal (WFM) and a second WFM, sequentially surrounding each layer and a portion of the dual layer TDC of the second stack with the high-k dielectric and the second WFM, forming gate metal around the first and second stacks and recessing the gate metal and the second WFM to a depth defined above a height of an uppermost first WFM horizontal portion.

20 Claims, 7 Drawing Sheets

WORK FUNCTION METAL PATTERNING AND MIDDLE-OF-LINE SELF-ALIGNED CONTACTS FOR NANOSHEET TECHNOLOGY

BACKGROUND

The present invention generally relates to fabrication methods and resulting structures for semiconductor devices. More specifically, the present invention relates to improved work function metal (WFM) patterning and middle-of-line (MOL) self-aligned contacts (SACs) for nanosheet technology.

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, lending to the fabrication of products with increased capacity. The drive for the ever-increasing capacity, however, is not without issue. The necessity to optimize the performance of each device and each interconnect becomes increasingly significant.

SUMMARY

Embodiments of the invention are directed to a semiconductor device fabrication method. A non-limiting example of the semiconductor device fabrication method includes forming first and second stacks each including a dual layer top dielectric cap (TDC), sequentially surrounding each layer and a portion of the dual layer TDC of the first stack with high-k dielectric, a first work function metal (WFM) and a second WFM, sequentially surrounding each layer and a portion of the dual layer TDC of the second stack with the high-k dielectric and the second WFM, forming gate metal around the first and second stacks and recessing the gate metal and the second WFM to a depth defined above a height of an uppermost first WFM horizontal portion.

Embodiments of the present invention are directed to a semiconductor device fabrication method. A non-limiting example of the semiconductor device fabrication method includes forming, on a substrate, first and second stacks each including lowermost and first and second uppermost first layers, interleaved second and third layers between the lowermost and second uppermost first layers and a fourth layer between the first and second uppermost first layers. The semiconductor device fabrication method further includes replacing the lowermost and first and second uppermost first layers with dielectric, removing the second and fourth layers, sequentially depositing high-k dielectric and a first work function metal (WFM) around the dielectric and the third layers, depositing a second WFM around the first WFM in the first stack and replacing the first WFM with the second WFM in the second stack, forming gate metal around the first and second stacks and recessing the gate metal and the second WFM to a depth defined above a height of an uppermost first WFM horizontal portion.

Embodiments of the present invention are directed to semiconductor device. A non-limiting example of the semiconductor device includes first and second gate stacks. The first gate stack includes multiple layers, a dual layer top dielectric cap (TDC) and high-k dielectric, a first work function metal (WFM) and a second WFM sequentially surrounding each layer and a portion of the dual layer TDC. The second gate stack includes multiple layers, a dual layer top dielectric cap (TDC) and high-k dielectric and the second WFM sequentially surrounding each layer and a portion of the dual layer TDC. Gate metal is formed around the first and second gate stacks. The gate metal and the second WFM are recessed to a depth defined above a height of an uppermost first WFM horizontal portion.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
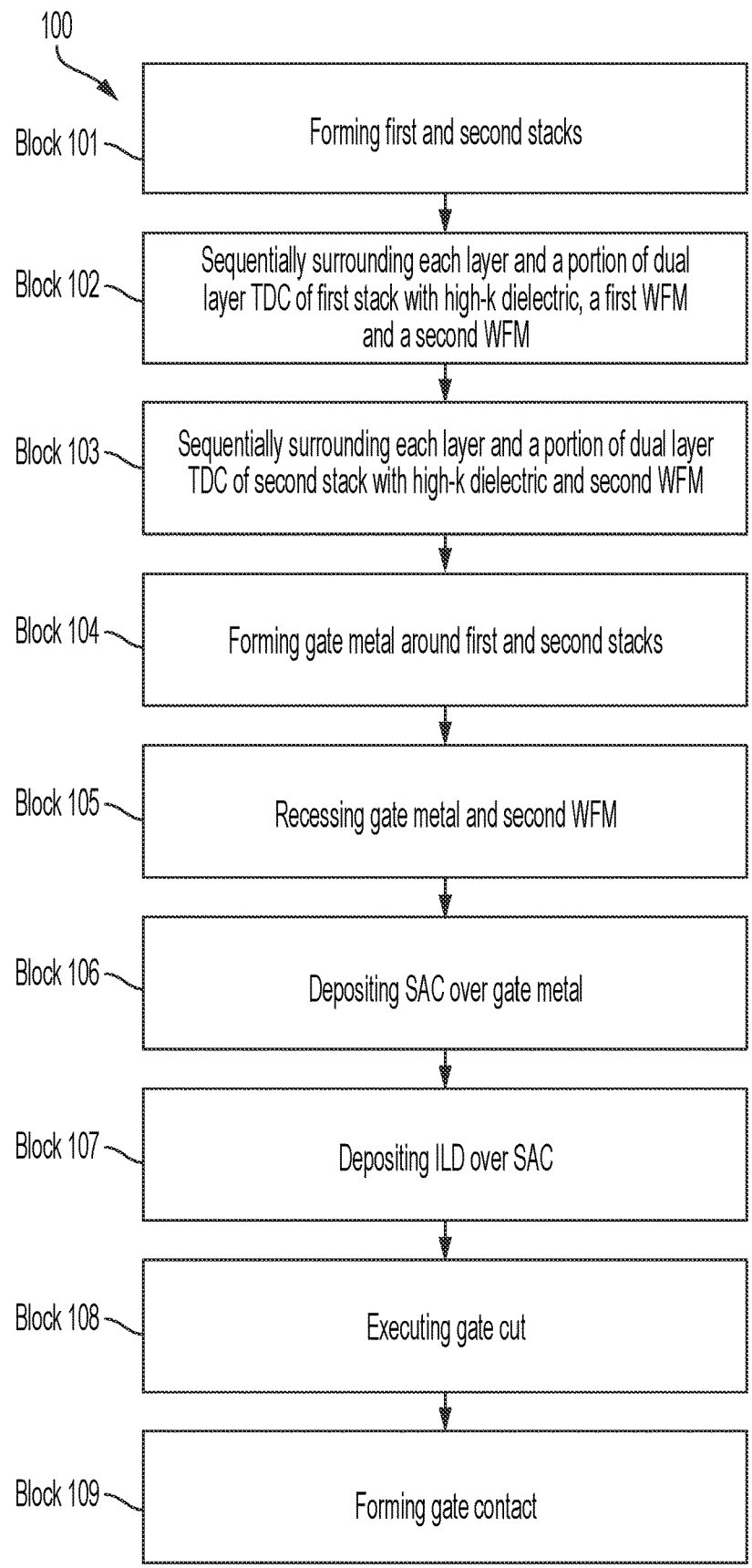
FIG. 1 is a flow diagram illustrating a semiconductor device fabrication method in accordance with one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the invention, Field-effect transistors (FET) include doped source/drain regions that are formed in a semiconductor and separated by a channel region. A gate insulation layer is positioned about the channel region and a conductive gate electrode is positioned over or about the gate insulation layer. The gate insulation layer and the gate electrode together may be referred to as the gate stack for the device. By applying an appropriate voltage to the gate electrode, the channel region becomes conductive and current is allowed to flow from the source region to the drain region.

To improve the operating speed of the FETs, and to increase the density of FETs on an integrated circuit (IC), designs have gradually become smaller in size. Reductions to the size and the channel length in FETs can improve the switching speed of the FETs.

A number of challenges arise as feature sizes of FETs and ICs get smaller. For example, significant downsizing of traditional FETs may produce electrostatic issues and mobility degradation. Scaled-down FETs may have shorter gate lengths that make it more difficult to control the channel. Device architectures such as "gate-all-around" active nanostructures allow further scaling of ICs, in part, because the gate is structured to wrap around the channel, creating more surface area and better control. This structure can provide better control with lower leakage current, faster operations, and lower output resistance. Active nanostructures used to form the channel can include a semiconductor nanowire, i.e., a vertically or horizontally oriented thin wire, or a plurality of stacked nanosheets, i.e., a plurality of vertically spaced semiconductor sheets.

In very small transistors such as nanostructure FETs, metal gates are used to provide high performance. The threshold voltage of a FET is the minimum voltage required to create the conducting path between the source and drain. Metal gates include a gate metal with a work function metal (WFM) and a layer having a high dielectric constant (high-k) in a combination known as high-k metal gate (HKMG). The WFM is typically located between the high-k layer and the metal gate, and is used to tune the threshold voltage of the transistor. The work function is the minimum energy (usually measured in electron volts) needed to remove an electron from a solid to a point immediately outside the solid surface (or energy needed to move an electron from the Fermi energy level into vacuum), i.e., the final electron position is far from the surface on the atomic scale but still close to the solid on the macroscopic scale. Different transistors may require different threshold voltages, and therefore different WFMs. For example, a PFET (a FET with a channel that contains holes) may require a different WFM than an NFET (a FET with a channel that contains electrons).

It has been found that, in some nanostructure FETs, there is a gate overburden that leads to parasitic capacitance. In addition, it has been found that patterning of nanosheet WFMs is difficult.

Turning now to an overview of the aspects of the invention, one or more embodiments of the invention address the above-described shortcomings of the prior art by providing a semiconductor device fabrication method including forming first and second gate stacks each including a dual layer top dielectric cap (TDC), sequentially surrounding each layer and a portion of the dual layer TDC of the first gate stack with high-k dielectric, a first work function metal (WFM) and a second WFM, sequentially surrounding each layer and a portion of the dual layer TDC of the second gate stack with the high-k dielectric and the second WFM, forming gate metal around the first and second gate stacks and recessing the gate metal and the second WFM to a depth defined above a height of an uppermost first WFM horizontal portion.

The above-described aspects of the invention address the shortcomings of the prior art by providing for a semiconductor device structure and a method of fabrication in which gate overburden is minimized to reduce parasitic capacitance and the difficulties associated with WFM patterning are overcome.

Turning now to a more detailed description of aspects of the present invention, FIG. 1 depicts a semiconductor device fabrication method 100. As shown in FIG. 1, the semiconductor device fabrication method 100 includes forming first and second stacks (block 101), where each of the first and second stacks includes a dual layer top dielectric cap (TDC), sequentially surrounding each layer and a portion of the dual layer TDC of the first stack with high-k dielectric, a first work function metal (WFM) and a second WFM (block 102), sequentially surrounding each layer and a portion of the dual layer TDC of the second stack with the high-k dielectric and the second WFM (block 103), forming gate metal around the first and second stacks (block 104) and recessing the gate metal and the second WFM to a depth defined above a height of an uppermost first WFM horizontal portion (block 105). The semiconductor device fabrication method further includes depositing a self-aligned cap (SAC) over the gate metal (block 106), depositing interlayer dielectric (ILD) over the SAC (block 107), executing a gate cut through the ILD and the SAC to the work function metal between the first and second stacks to form a contact opening (block 108) and forming a gate contact in the contact opening (block 109).

A height of the gate contact can be a fraction of a height of an uppermost surface of the ILD from the substrate. In some cases, the height of the gate contact can be a relatively small fraction of the height of the uppermost surface of the ILD from the substrate.

The recessing of block 105 can include recessing the gate metal and the second WFM to a range of depths that are defined above the height of the uppermost first WFM horizontal portion. Alternatively, the recessing of block 105 can include recessing the gate metal and the second WFM to a depth that is defined just above the height of the uppermost first WFM horizontal portion.

Figure 2:
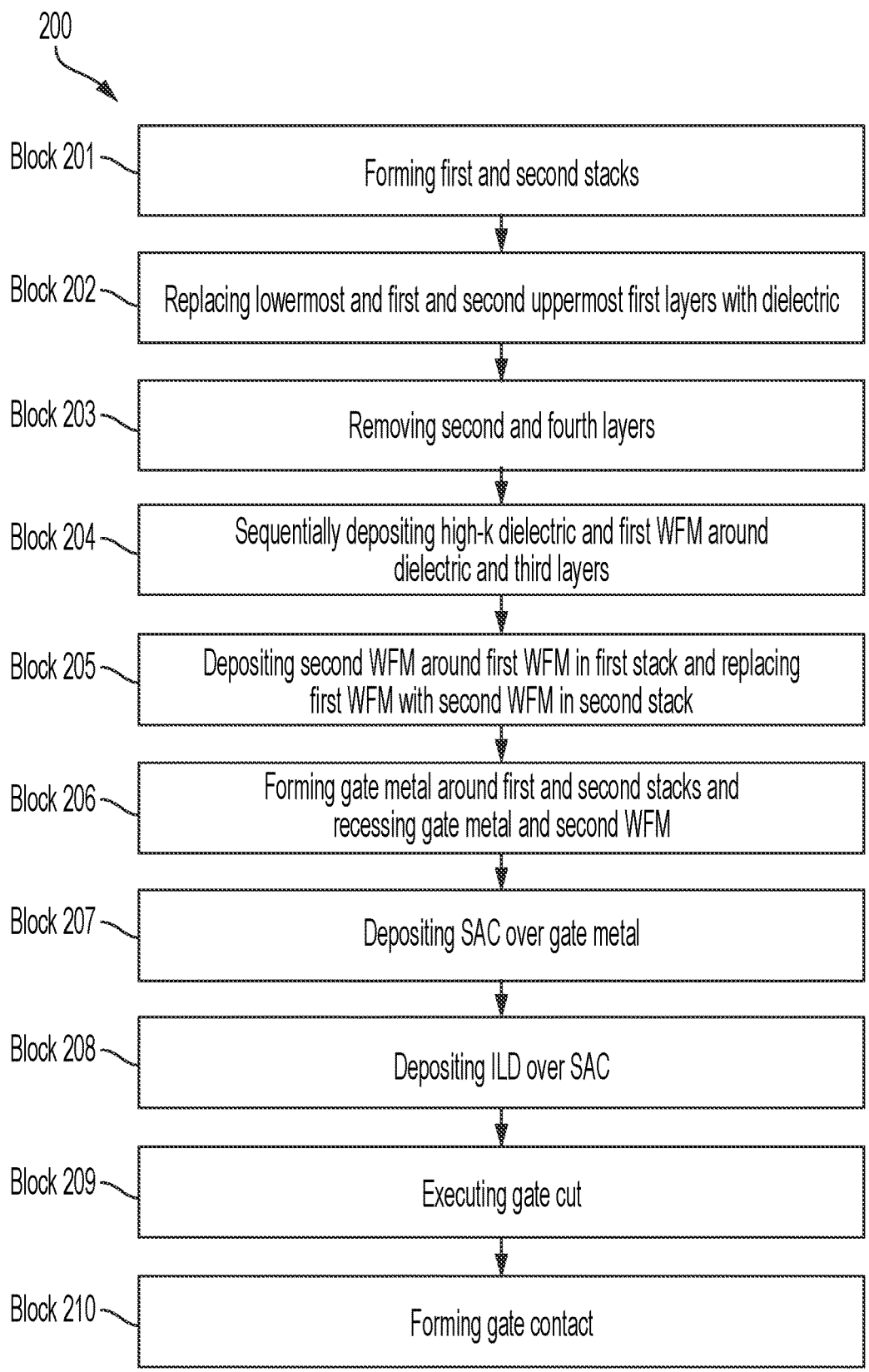
FIG. 2 is a flow diagram illustrating a semiconductor device fabrication method in accordance with one or more embodiments of the present invention.

With reference to FIG. 2, a semiconductor device fabrication method 200 is provided. As shown in FIG. 2, the semiconductor device fabrication method 200 includes forming, on a substrate, first and second stacks that each include lowermost and first and second uppermost first layers, interleaved second and third layers between the lowermost and second uppermost first layers and a fourth layer between the first and second uppermost first layers (block 201), replacing the lowermost and first and second uppermost first layers with dielectric (block 202), removing the second and fourth layers (block 203) and sequentially depositing high-k dielectric and a first work function metal (WFM) around the dielectric and the third layers (block 204) such that the first WFM does not fill space between the high-k dielectric. The semiconductor device fabrication method 200 also includes depositing a second WFM around the first WFM in the first stack and replacing the first WFM with the second WFM in the second stack (block 205), forming gate metal around the first and second stacks and recessing (by, e.g., etching or dry etching) the gate metal and the second WFM to a depth defined above a height of an uppermost first WFM horizontal portion (block 206).

The first and second stacks are formed on an uppermost surface of the substrate and the substrate includes silicon and shallow trench isolation (STI) between the first and second stacks. The lowermost first layer, the first uppermost first layer and the second uppermost first layer each include silicon germanium 55 (SiGe55). The second layers and the fourth layer each include silicon germanium 30 (SiGe30). The third layers each include silicon. The following description will apply to these features. This is done for purposes of clarity and brevity.

With continued reference to FIG. 2, the semiconductor device fabrication method 200 further includes depositing an SAC over the gate metal (block 207), depositing ILD over the SAC (block 208), executing a gate cut through the ILD and the SAC to the work function metal between the first and second stacks to form a contact opening (block 209) and forming a gate contact in the contact opening (block 210).

A height of the gate contact can be a fraction of a height of an uppermost surface of the ILD from the substrate. In some cases, the height of the gate contact can be a relatively small fraction of the height of the uppermost surface of the ILD from the substrate.

The replacing of the first and second uppermost first layers with dielectric of block 202 and the depositing of the high-k dielectric around the dielectric of block 204 forms a top dielectric cap (TDC) that provides a process margin for the recessing of block 206. The TDC is a two-layer TDC. With the process margin provided by the TDC, the recessing of the gate metal and the second WFM of block 206 can be executed to a range of depths that are defined above the height of the uppermost first WFM horizontal portion. Alternatively, with the process margin provided by the TDC, the recessing of the gate metal and the second WFM of block 205 can be executed to a depth that is defined just above the height of the uppermost first WFM horizontal portion.

With continued reference to FIGS. 1 and 2 and with additional reference to FIG. 3 and to FIGS. 4-12, the semiconductor device fabrication methods 100 and 200 will now be described in greater detail.

Figure 3:
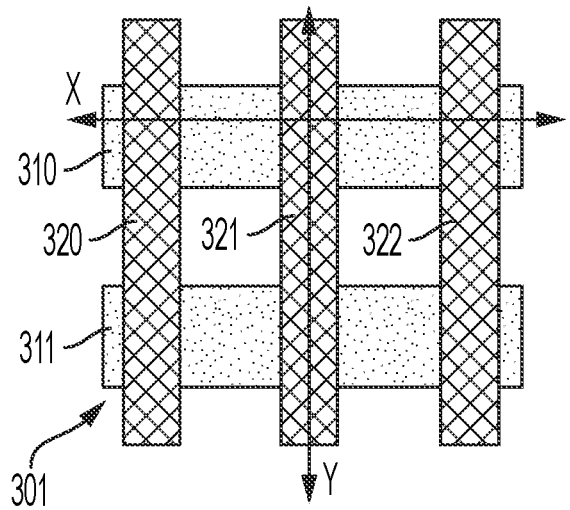
FIG. 3 is a top-down view of a semiconductor device assembly being fabricated in accordance with one or more embodiments of the present invention.

FIG. 3 depicts a top-down view of a semiconductor device assembly 301 that is being fabricated. The semiconductor device assembly 301 includes active regions 310, 311 and gate regions 320, 321, 322 extending across the active regions 310, 311. For reference, the "X" cross-sectional cut line of FIG. 3 corresponds to the perspective of the image in FIG. 5 and the "Y" cross-sectional cut line of FIG. 3 corresponds to the perspective of the images in FIG. 4 and in FIGS. 6-12.

Figure 4:
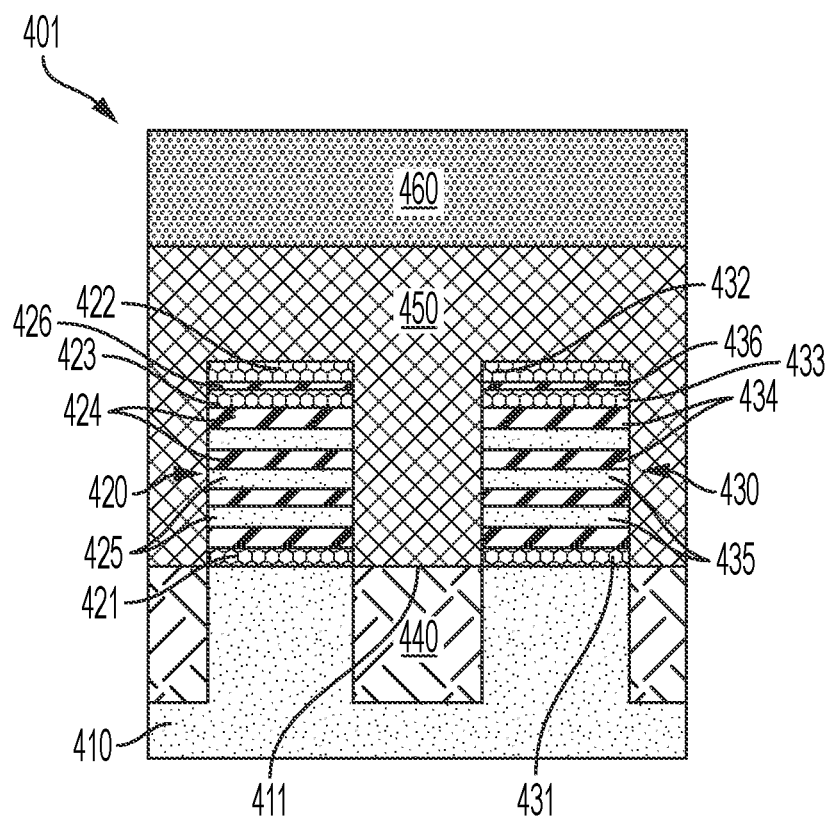
FIG. 4 is a side, cross-sectional view of a semiconductor device assembly at an initial stage of assembly following nanosheet patterning, shallow trench isolation (STI) formation and dummy gate formation taken along line "Y" of FIG. 3 in accordance with one or more embodiments of the present invention.

With reference to FIG. 4, a semiconductor device assembly 401 at an initial stage of assembly is provided following nanosheet patterning, shallow trench isolation (STI) formation and dummy gate formation. The semiconductor device assembly 401 includes a substrate 410, which is formed of silicon and which has an uppermost surface 411, a first nanosheet stack 420, a second nanosheet stack 430, STI 440 formed in the substrate 410 at least between the first nanosheet stack 420 and the second nanosheet stack 430, a dummy gate 450 formed around the first nanosheet stack 420 and the second nanosheet stack 430 and a hard mask 460 formed on the dummy gate 450.

The first nanosheet stack 420 includes a lowermost layer 421 of first semiconductor material (SiGe55), first and second uppermost layers 422, 423 of the first semiconductor material (SiGe55), interleaved layers 424 of second semiconductor material (SiGe30) and layers 425 of third semiconductor material (Si) between the lowermost layer 421 and the second uppermost layer 423 and a layer 426 of fourth semiconductor material (Si) between the first uppermost layer 422 and the second uppermost layer 423.

The second nanosheet stack 430 includes a lowermost layer 431 of the first semiconductor material (SiGe55), first and second uppermost layers 432, 433 of the first semiconductor material (SiGe55), interleaved layers 434 of second semiconductor material (SiGe30) and layers 435 of third semiconductor material (Si) between the lowermost layer 431 and the second uppermost layer 433 and a layer 436 of fourth semiconductor material (Si) between the first uppermost layer 432 and the second uppermost layer 433.

Figure 6:
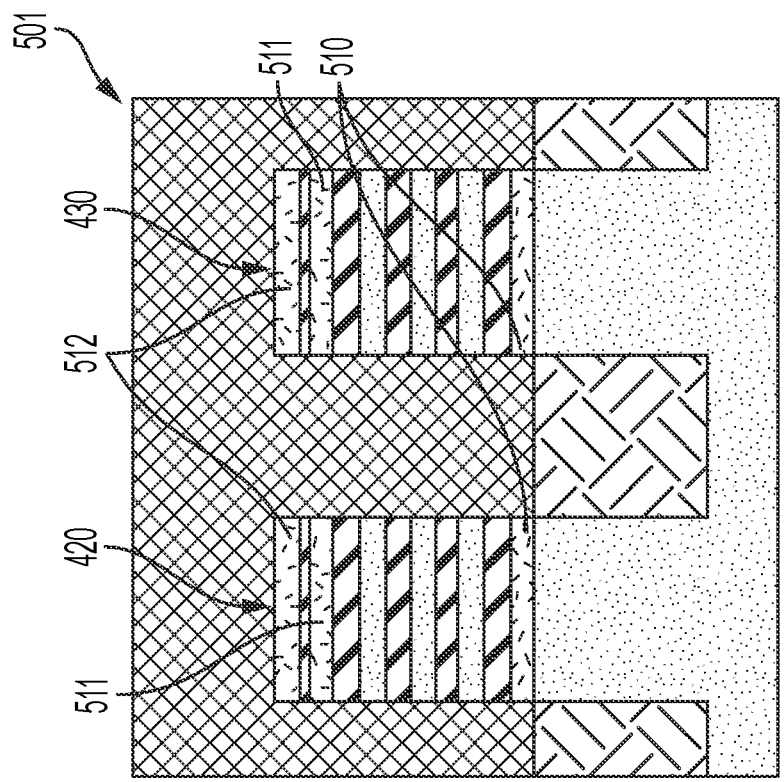
FIG. 6 is a side, cross-sectional view of a semiconductor device assembly at a second stage of assembly following removal of layers of a first semiconductor, spacer liner deposition, spacer etching, semiconductor layer indentation, inner spacer formation, source/drain (S/D) epitaxial formation and interlayer dielectric (ILD) deposition applied to the semiconductor device assembly of FIG. 4 taken along line "Y" of FIG. 3 in accordance with one or more embodiments of the present invention.
Figure 5:
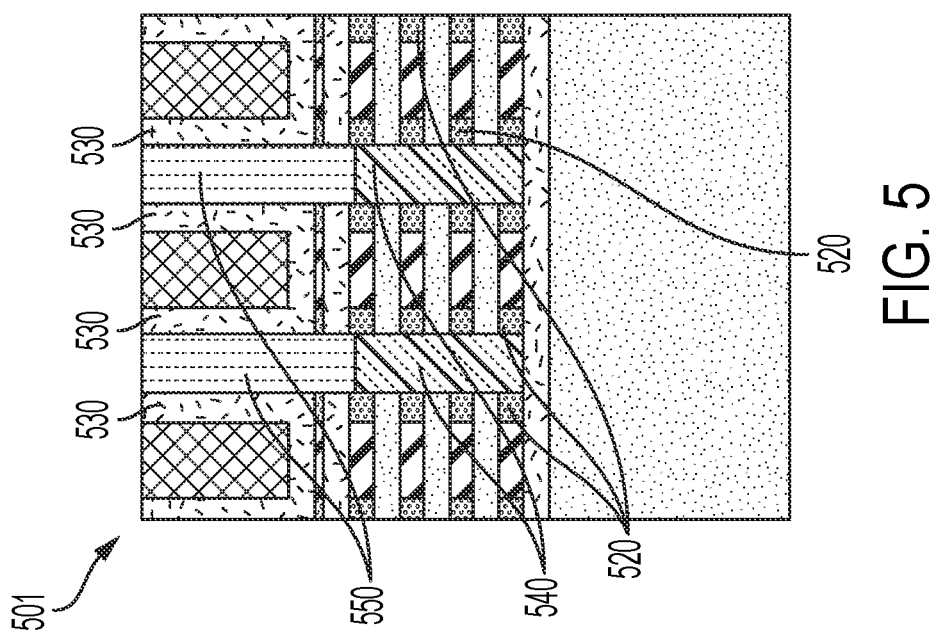
FIG. 5 is a side, cross-sectional view of a semiconductor device assembly at a second stage of assembly following removal of layers of a first semiconductor, spacer liner deposition, spacer etching, semiconductor layer indentation, inner spacer formation, source/drain (S/D) epitaxial formation and interlayer dielectric (ILD) deposition applied to the semiconductor device assembly of FIG. 4 taken along line "X" of FIG. 3 in accordance with one or more embodiments of the present invention.

With reference to FIGS. 5 and 6, a semiconductor device assembly 501 at a second stage of assembly is provided following removal of the lowermost layers 421, 431, removal of the second uppermost layers 423, 433, removal of the first uppermost layers 422, 432, spacer liner deposition, spacer etching, semiconductor layer indentation, inner spacer formation, source/drain (S/D) epitaxial formation and ILD deposition applied to the semiconductor device assembly 401 of FIG. 4. The semiconductor device assembly 501 includes, in each of the first nanosheet stack 420 and the second nanosheet stack 430, dielectric spacer material 510 in place of the lowermost layers 421, 431 of FIG. 4, dielectric spacer material 511 in place of the second uppermost layers 423, 433 of FIG. 4 and dielectric spacer material 512 in place of the first uppermost layers 422, 432 of FIG. 4. The semiconductor device assembly 501 further includes, in each of the first nanosheet stack 420 and the second nanosheet stack 430, inner spacers 520 formed where the second layers 424, 434 of FIG. 4 were indented and spacers 530 as well as source/drain (S/D) epitaxy 540 and ILD 550 disposed in openings defined between the inner spacers 520 and the spacers 530.

Figure 7:
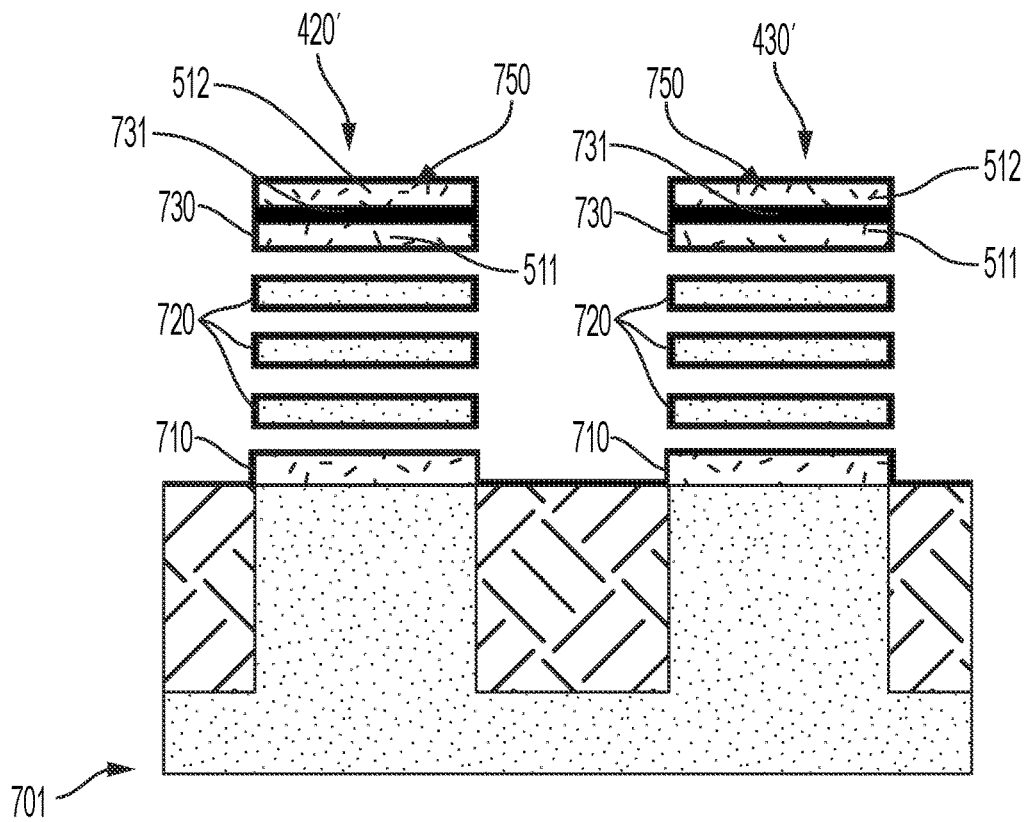
FIG. 7 is a side, cross-sectional view of a semiconductor device assembly at a third stage of assembly following dummy gate removal, semiconductor layer release and high-k dielectric material deposition applied to the semiconductor device assembly of FIGS. 5 and 6 taken along line "Y" of FIG. 3 in accordance with one or more embodiments of the present invention.

With reference to FIG. 7, a semiconductor device assembly 701 at a third stage of assembly is provided following dummy gate removal, semiconductor layer release of the second semiconductor material (SiGe30) of layers 424, 434 of FIG. 4 and high-k dielectric material (e.g. hafnium oxide, $HfO_2$) deposition applied to the semiconductor device assembly 501 of FIGS. 5 and 6. The semiconductor device assembly 701 includes, in each of the first gate stack 420' (formerly the first nanosheet stack 420) and the second gate stack 430' (formerly the second nanosheet stack 430), a layer 710 of the high-k dielectric material disposed on the dielectric spacer material 510 and the STI 440, layers 720 of the high-k dielectric material disposed about the layers 425 of the third semiconductor material (Si) and layers 730, 731 of the high-k dielectric material disposed about and between the dielectric spacer material 511 and the dielectric spacer material 512. The layer 731 can completely fill the space between the dielectric spacer material 511 and the dielectric spacer material 512.

The semiconductor device assembly 701 thus includes a TDC 750 for each of the first gate stack 420' and the second gate stack 430'. The TDCs 750 are each formed of the dielectric spacer material 511, 512 and the layers 730, 731 of the high-k dielectric material. As shown in FIG. 7, the TDCs 750 can each be provided as a dual layer TDC 750. The TDCs 750 are each sufficiently thick to provide for an adequate processing margin for subsequent recessing operations to be described below.

Figure 8:
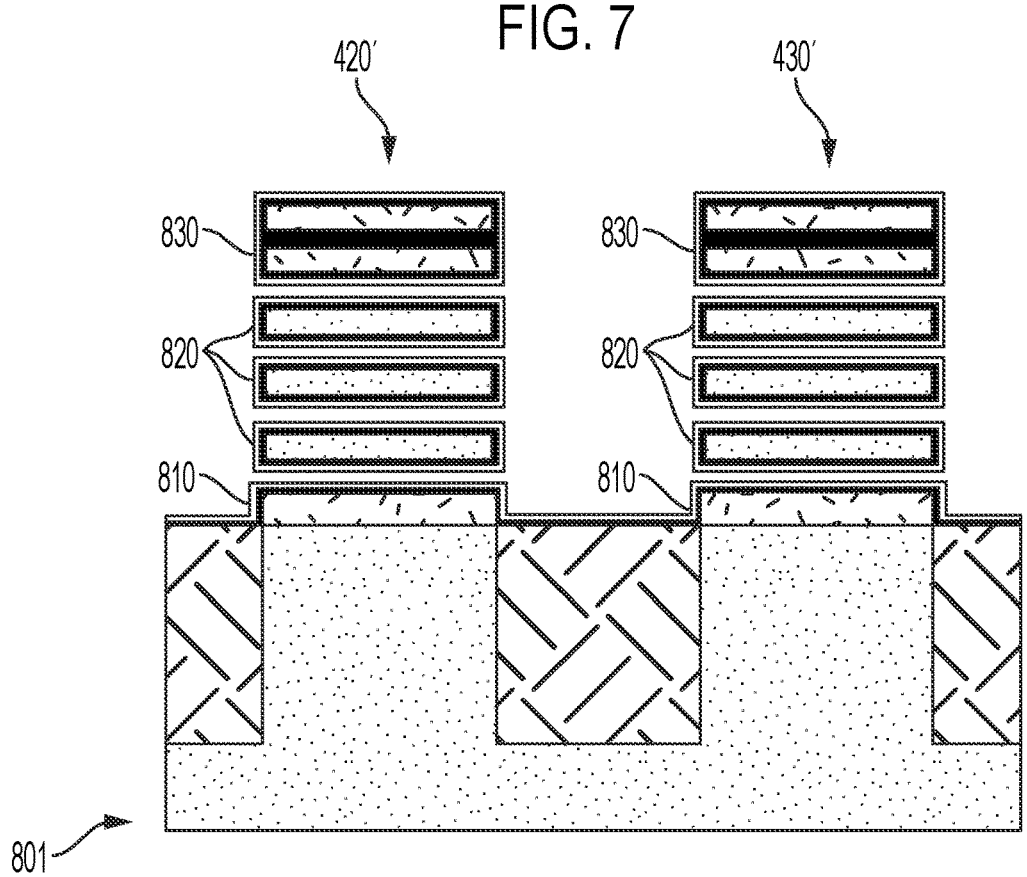
FIG. 8 is a side, cross-sectional view of a semiconductor device assembly at a fourth stage of assembly following first work function metal (WFM) deposition applied to the semiconductor device assembly of FIG. 7 taken along line "Y" of FIG. 3 in accordance with one or more embodiments of the present invention.

With reference to FIG. 8, a semiconductor device assembly 801 at a fourth stage of assembly is provided following first WFM deposition applied to the semiconductor device assembly 701 of FIG. 7. The semiconductor device assembly 801 includes, in each of the first gate stack 420' and the second gate stack 430', a layer 810 of the first WFM on the layer 710 of FIG. 7, layers 820 of the first WFM on the layers 720 of FIG. 7 and a layer 830 of the first WFM surrounding the TDC 750 of FIG. 7.

Figure 9:
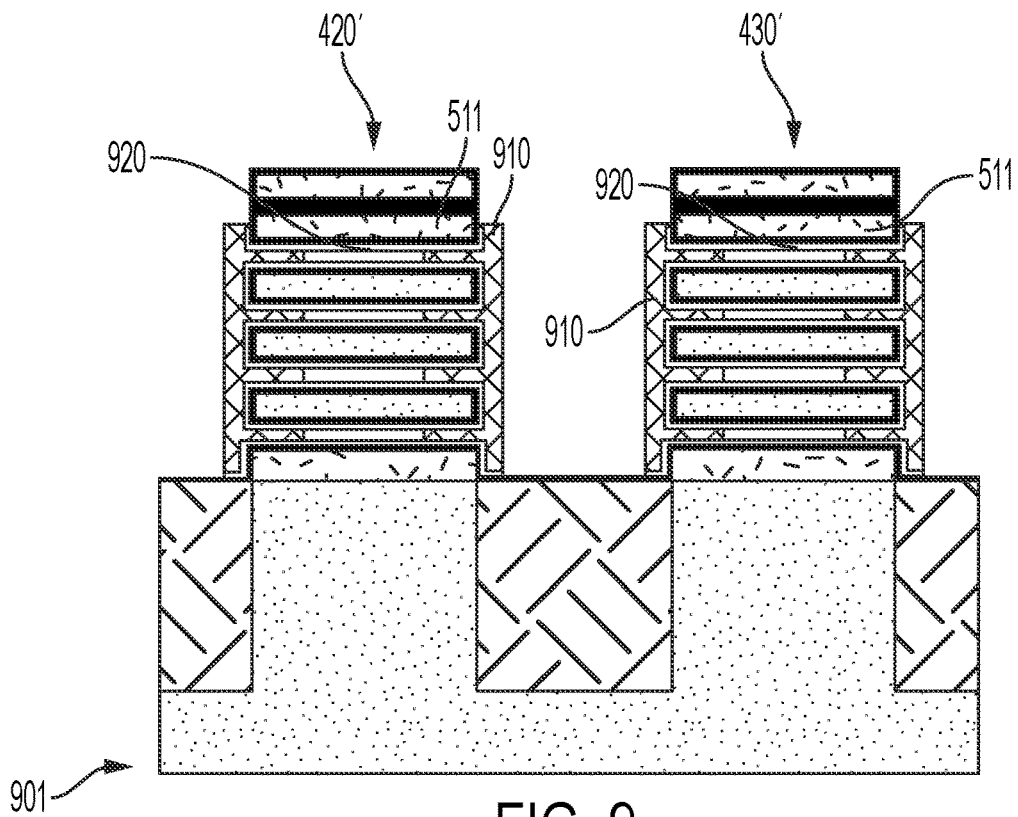
FIG. 9 is a side, cross-sectional view of a semiconductor device assembly at a fifth stage of assembly following WFM sealing liner deposition, WFM sealing liner etching and first WFM etching applied to the semiconductor device assembly of FIG. 8 taken along line "Y" of FIG. 3 in accordance with one or more embodiments of the present invention.

With reference to FIG. 9, a semiconductor device assembly 901 at a fifth stage of assembly is provided following WFM sealing liner deposition, WFM sealing liner etching and first WFM etching applied to the semiconductor device assembly 801 of FIG. 8. The semiconductor device assembly 901 includes, in each of the first gate stack 420' and the second gate stack 430', WFM sealing liner 910 along respective sides of the first gate stack 420' and the second gate stack 430'. The WFM sealing liner 910 protrudes into but does not necessarily fill the spaces 911 between the layers 810, 820 and 830 of the first WFM of FIG. 8. Due to the WFM sealing liner etching and the first WFM etching, in each of the first gate stack 420' and the second gate stack 430', the layer 830 of the first WFM of FIG. 8 surrounding the TDC 750 of FIG. 7 is removed but for the uppermost first WFM horizontal portion 920 of the first WFM and short vertical portions of the first WFM and uppermost edges of the WFM sealing liner 910 are coplanar with the terminals of the short vertical portions of the first WFM.

Figure 10:
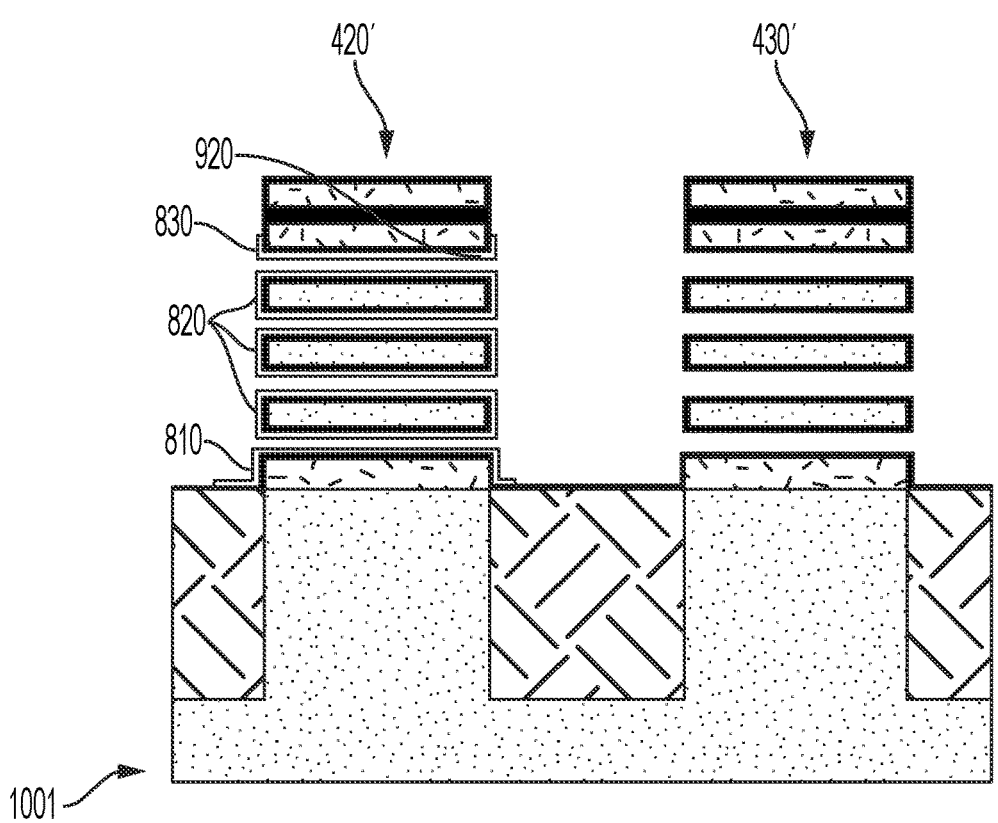
FIG. 10 is a side, cross-sectional view of a semiconductor device assembly at a sixth stage of assembly following WFM patterning, removal of a portion of the first WFM, organic planarization layer (OPL) stripping and WFM sealing liner removal applied to the semiconductor device assembly of FIG. 9 taken along line "Y" of FIG. 3 in accordance with one or more embodiments of the present invention.

With reference to FIG. 10, a semiconductor device assembly 1001 at a sixth stage of assembly is provided following WFM patterning, removal of a portion of the first WFM, organic planarization layer (OPL) stripping and WFM sealing liner removal applied to the semiconductor device assembly 901 of FIG. 9. The semiconductor device assembly 1001 is similar to the semiconductor device assembly 901 of FIG. 9 except that the WFM sealing liner 910 of FIG. 9 is removed entirely and the first WFM is removed from the second gate stack 430'.

Figure 11:
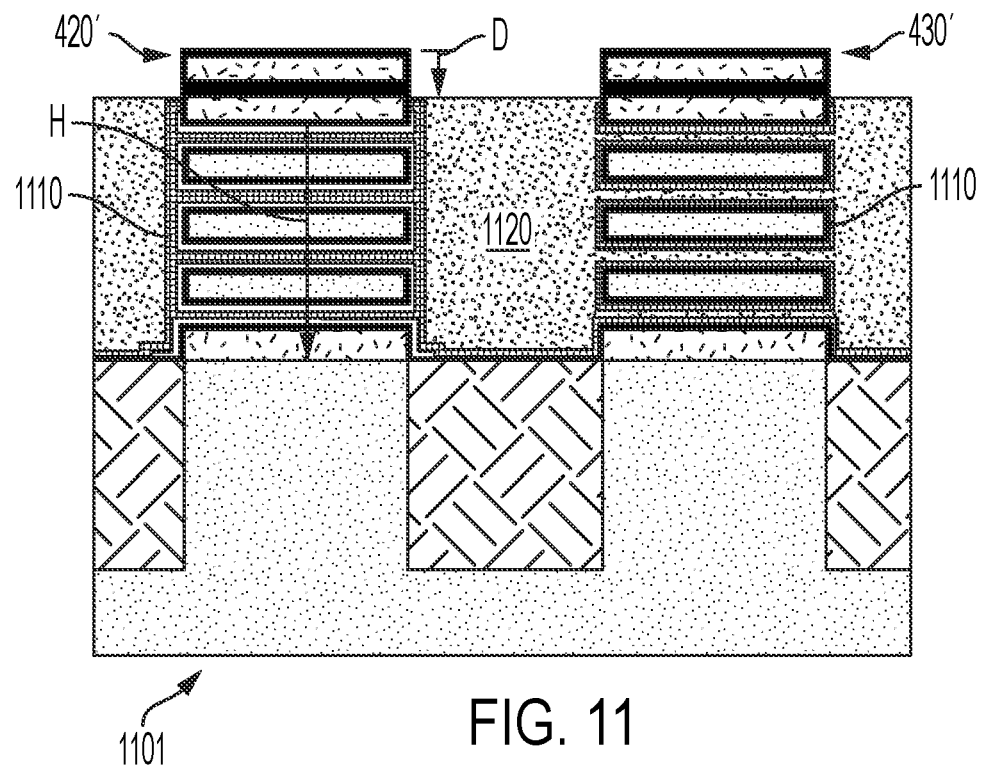
FIG. 11 is a side, cross-sectional view of a semiconductor device assembly at a seventh stage of assembly following deposition of a second WFM, a gate metal filling operation and a recession of the gate metal applied to the semiconductor device assembly of FIG. 10 taken along line "Y" of FIG. 3 in accordance with one or more embodiments of the present invention.

With reference to FIG. 11, a semiconductor device assembly 1101 at a seventh stage of assembly is provided following deposition of a second WFM, a gate metal filling operation and a recession of the gate metal applied to the semiconductor device assembly 1001 of FIG. 10. The semiconductor device assembly 1101 includes the layers 710, 720 and 730, 731 of the high-k dielectric material of FIG. 7 as well as the layers 810, 820 and 830 of the first WFM of FIG. 8 in the first gate stack 420' and the layers 710, 720 and 730, 731 of the high-k dielectric material of FIG. 7 in the second gate stack 430'. The semiconductor device assembly 1101 further includes the second WFM 1110 deposited in the first gate stack 420' and the second gate stack 430'. The second WFM 1110 surrounds the layers 810, 820 and 830 of the first WFM of FIG. 8 in the first gate stack 420' and surrounds the layers 710, 720 and 730, 731 of the high-k dielectric material of FIG. 7 in the second gate stack 430'. The semiconductor device assembly 1101 also includes gate metal 1120. The gate metal 1120 is deposited around the first gate stack 420' and the second gate stack 430' and is subsequently recessed along with exposed portions of the second WFM 1110 as shown in FIG. 11.

The gate metal 1120 and the exposed portions of the second WFM 1110 can be recessed to a depth D, which is defined above a height H of the uppermost first WFM horizontal portion 920. In some cases, due to the process margin provided by the TDC 750, the gate metal 1120 and the exposed portions of the second WFM 1120 can be recessed to a range of depths, which are defined above the height H of the uppermost first WFM horizontal portion 920. In other cases, the gate metal 1120 and the exposed portions of the second WFM 1120 can be recessed to a depth, which is defined just above the height H of the uppermost first WFM horizontal portion 920.

Figure 12:
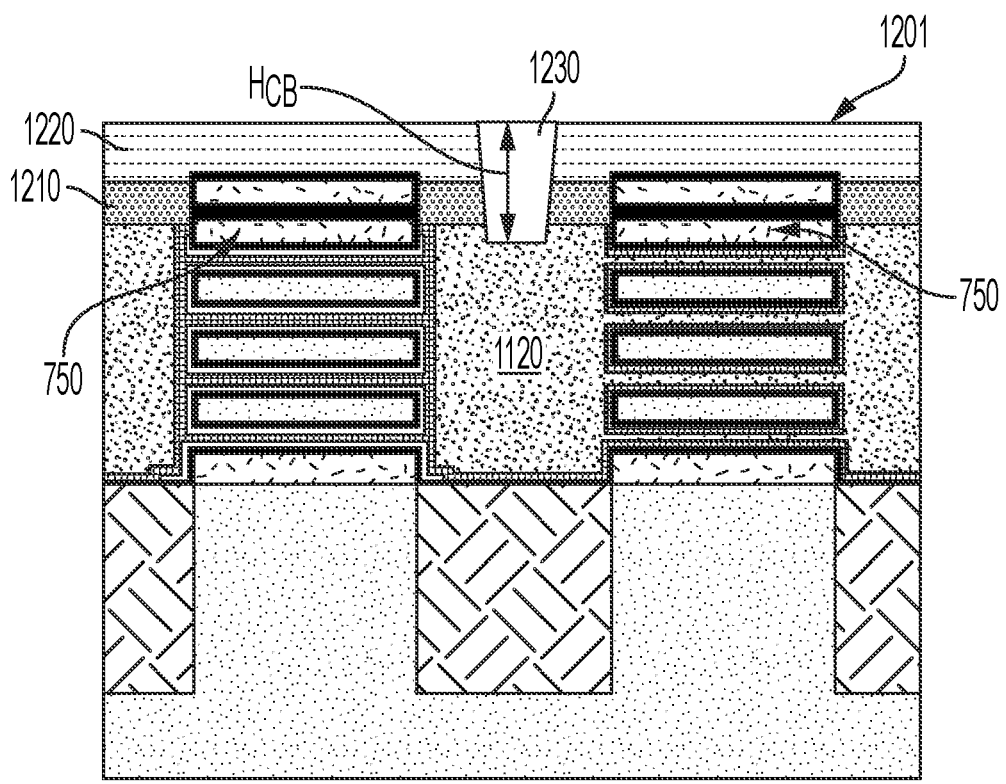
FIG. 12 is a side, cross-sectional view of a semiconductor device assembly at a final stage of assembly following self-aligned cap (SAC) deposition, ILD deposition, gate cutting and gate contact formation applied to the semiconductor device assembly of FIG. 11 taken along line "Y" of FIG. 3 in accordance with one or more embodiments of the present invention.

With reference to FIG. 12, a semiconductor device assembly 1201 at a final stage of assembly is provided following SAC deposition, ILD deposition, gate cutting and gate contact formation applied to the semiconductor device assembly 1101 of FIG. 11. The semiconductor device assembly 1201 includes an SAC cap 1210, an ILD layer 1220 disposed on the SAC cap 1210 and a gate contact 1230. The SAC cap 1210 extends upwardly from an uppermost surface of the gate metal 1120 to the uppermost plane of the TDCs 750. The ILD layer 1220 extends across a substantial entirety of the SAC cap 1210 and the TDCs 750. The gate contact 1230 extends through the ILD layer 1220 and the SAC cap 1210 to the gate metal 1120.

Due to the height of the gate metal 1120 having been recessed as described above, the height HCB of the gate contact 1230 is minimized, which results in minimized S/D contact-to-gate capacitance.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device fabrication method, comprising:
    forming first and second stacks each comprising a dual layer top dielectric cap (TDC);
    sequentially surrounding each layer and a portion of the dual layer TDC of the first stack with high-k dielectric, a first work function metal (WFM) and a second WFM;
    sequentially surrounding each layer and a portion of the dual layer TDC of the second stack with the high-k dielectric and the second WFM;
    forming gate metal around the first and second stacks; and
    recessing the gate metal and the second WFM to a depth defined above a height of an uppermost first WFM horizontal portion.

2. The semiconductor device fabrication method according to claim 1, further comprising:
    depositing a self-aligned cap (SAC) over the gate metal;
    depositing interlayer dielectric (ILD) over the SAC; and
    executing a gate cut through the ILD and the SAC to the work function metal between the first and second stacks to form a contact opening.

3. The semiconductor device fabrication method according to claim 2, further comprising forming a gate contact in the contact opening.

4. The semiconductor device fabrication method according to claim 3, wherein a height of the gate contact is a fraction of a height of an uppermost surface of the ILD from the substrate.

5. The semiconductor device fabrication method according to claim 1, wherein the recessing comprises recessing the gate metal and the second WFM to a range of depths defined above the height of the uppermost first WFM horizontal portion.

6. The semiconductor device fabrication method according to claim 1, wherein the recessing comprises recessing the gate metal and the second WFM to a depth defined above the height of the uppermost first WFM horizontal portion.

7. A semiconductor device fabrication method, comprising:
    forming, on a substrate, first and second stacks each comprising lowermost and first and second uppermost first layers, interleaved second and third layers between the lowermost and second uppermost first layers and a fourth layer between the first and second uppermost first layers;
    replacing the lowermost and first and second uppermost first layers with dielectric;
    removing the second and fourth layers;

sequentially depositing high-k dielectric and a first work function metal (WFM) around the dielectric and the third layers;

depositing a second WFM around the first WFM in the first stack and replacing the first WFM with the second WFM in the second stack;

forming gate metal around the first and second stacks; and recessing the gate metal and the second WFM to a depth defined above a height of an uppermost first WFM horizontal portion.

8. The semiconductor device fabrication method according to claim 7, wherein:

the first and second stacks are formed on an uppermost surface of the substrate, the substrate comprises silicon and shallow trench isolation (STI) between the first and second stacks, the lowermost and first and second uppermost first layers comprise silicon germanium 55, the second and fourth layers comprise silicon germanium 30, and the third layers comprise silicon.

9. The semiconductor device fabrication method according to claim 7, further comprising:

depositing a self-aligned cap (SAC) over the gate metal;

depositing interlayer dielectric (ILD) over the SAC;

executing a gate cut through the ILD and the SAC to the work function metal between the first and second stacks to form a contact opening; and forming a gate contact in the contact opening.

10. The semiconductor device fabrication method according to claim 9, wherein a height of the gate contact is a fraction of a height of an uppermost surface of the ILD from the substrate.

11. The semiconductor device fabrication method according to claim 7, wherein the replacing of the first and second uppermost first layers with the dielectric and the depositing of the high-k dielectric around the dielectric forms a top dielectric cap (TDC) that provides a process margin for the recessing.

12. The semiconductor device fabrication method according to claim 11, wherein the TDC is a two-layer TDC.

13. The semiconductor device fabrication method according to claim 7, wherein the depositing of the first WFM does not fill space between the high-k dielectric.

14. The semiconductor device fabrication method according to claim 7, wherein the recessing comprises etching.

15. The semiconductor device fabrication method according to claim 7, wherein the recessing comprises recessing the gate metal and the second WFM to a range of depths defined above the height of the uppermost first WFM horizontal portion.

16. The semiconductor device fabrication method according to claim 7, wherein the recessing comprises recessing the gate metal and the second WFM to a depth defined above the height of the uppermost first WFM horizontal portion.

17. A semiconductor device, comprising:

first and second gate stacks, the first gate stack comprising multiple layers, a first dual layer top dielectric cap (TDC) and high-k dielectric, a first work function metal (WFM) and a second WFM sequentially surrounding each layer and a portion of the dual layer TDC and the second gate stack comprising multiple layers, a second dual layer top dielectric cap (TDC) and high-k dielectric and the second WFM sequentially surrounding each layer and a portion of the dual layer TDC; and gate metal formed around the first and second gate stacks, the gate metal and the second WFM being recessed to a depth defined above a height of an uppermost first WFM horizontal portion.

18. The semiconductor device according to claim 17, further comprising:

a self-aligned cap (SAC) over the gate metal;

interlayer dielectric (ILD) over the SAC; and a gate contact extending through the ILD and the SAC to the work function metal between the first and second stacks.

19. The semiconductor device according to claim 17, wherein the gate metal and the second WFM are recessed to a range of depths defined above the height of the uppermost first WFM horizontal portion.

20. The semiconductor device according to claim 17, wherein the gate metal and the second WFM are recessed to a depth defined above the height of the uppermost first WFM horizontal portion.

* * * * *